(12) United States Patent
Qiao (10) Patent No.: US 12,254,956 B2
(45) Date of Patent: *Mar. 18, 2025

(54) CURRENT CONTROL CIRCUIT AND DISCHARGE ENABLE CIRCUIT FOR DISCHARGING BIT LINES OF MEMORY DEVICE AND OPERATION METHOD THEREOF

(71) Applicant: YANGTZE MEMORY TECHNOLOGIES CO., LTD., Wuhan (CN)

(72) Inventor: Liang Qiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,873

(22) Filed: Jan. 15, 2024

(65) Prior Publication Data

US 2024/0153544 A1    May 9, 2024

Related U.S. Application Data

(63) Continuation of application No. 17/307,924, filed on May 4, 2021, now Pat. No. 11,915,786, which is a
(Continued)

(51) Int. Cl.
*G11C 7/12*      (2006.01)
*G11C 16/04*     (2006.01)
(Continued)

(52) U.S. Cl.
CPC ............ *G11C 7/12* (2013.01); *G11C 16/0483* (2013.01); *G11C 16/24* (2013.01); *H03K 19/1737* (2013.01)

(58) Field of Classification Search
CPC ....... G11C 7/12; G11C 16/0483; G11C 16/24; G11C 8/08; H03K 19/1737
See application file for complete search history.

(56) References Cited

U.S. PATENT DOCUMENTS 6,434,736 B1 *  8/2002  Schaecher ............... G11C 8/18
                                                        716/111
9,887,011 B1 *  2/2018  Hung ..................... G11C 16/10
(Continued)

FOREIGN PATENT DOCUMENTS

CN            105009219 A  * 10/2015  ......... G11C 11/5628

OTHER PUBLICATIONS

International Search Report issued in corresponding International Application No. PCT/CN2021/083838 mailed Dec. 30, 2021, 4 pages.

*Primary Examiner* — Mushfique Siddique
(74) *Attorney, Agent, or Firm* — BAYES PLLC (57) ABSTRACT

A memory device includes an array of memory cells, a plurality of bit lines, a current control circuit, and a discharge enable circuit coupled between the current control circuit and a ground. The array of memory cells includes a plurality of columns of memory cells. The plurality of bit lines are respectively coupled to the plurality of columns of memory cells. First terminals of the first transistors each is in connection with one of the bit lines. Second terminals of the first transistors each is in connection with the discharge enable circuit. Third terminals of the first transistors are in connection with a reference current generator of the current control circuit.

20 Claims, 9 Drawing Sheets

Related U.S. Application Data continuation of application No. PCT/CN2021/083838, filed on Mar. 30, 2021.

(51) Int. Cl.
   *G11C 16/24* (2006.01)
   *H03K 19/173* (2006.01)

(56) References Cited

U.S. PATENT DOCUMENTS

| | | |
|---|---|---|
| 2003/0174574 A1 | 9/2003 | Perner et al. |
| 2008/0123434 A1* | 5/2008 | Kuriyama ............... G11C 16/14 |
| | | 365/185.29 |
| 2008/0247251 A1 | 10/2008 | Genevaux et al. |
| 2010/0020594 A1 | 1/2010 | De Sandre et al. |
| 2011/0116296 A1 | 5/2011 | Kitagawa et al. |
| 2014/0003154 A1 | 1/2014 | Abe et al. |
| 2016/0012870 A1* | 1/2016 | Chen ..................... G11C 11/419 |
| | | 365/189.09 |
| 2016/0071601 A1 | 3/2016 | Shirakawa et al. |
| 2017/0092362 A1* | 3/2017 | Takekida .................. G11C 7/12 |
| 2019/0348131 A1 | 11/2019 | Watanabe et al. |
| 2020/0174786 A1 | 6/2020 | Zhang et al. |

\* cited by examiner

CURRENT CONTROL CIRCUIT AND DISCHARGE ENABLE CIRCUIT FOR DISCHARGING BIT LINES OF MEMORY DEVICE AND OPERATION METHOD THEREOF

CROSS-REFERENCE TO RELATED APPLICATIONS

This application is a continuation of U.S. application Ser. No. 17/307,924, filed on May 4, 2021, which is a continuation of International Application No. PCT/CN2021/083838, filed on Mar. 30, 2021, entitled "MEMORY DEVICE AND OPERATION METHOD THEREOF," both of which are hereby incorporated by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. During the read/program/erase operations of the Flash memory, the bit lines of the Flash memory have to be discharged at the end of algorithms. The amount of the charge which needs to be discharged is determined by the number of bit lines.

SUMMARY

Memory devices and operation methods are disclosed herein.

In one aspect, a memory device is disclosed. The memory device includes an array of memory cells, a plurality of bit lines, a current control circuit and a discharge enable circuit. The array of memory cells includes a plurality of columns of memory cells. The plurality of bit lines are respectively coupled to the plurality of columns of memory cells. The current control circuit is coupled to the plurality of bit lines to control a discharge current in a discharge operation. The discharge enable circuit is coupled to the current control circuit to enable the discharge operation. The discharge operation discharges a charge on the plurality of bit lines.

In another aspect, a memory system is disclosed. The memory system includes a memory device for storing data. The memory device includes an array of memory cells, a plurality of bit lines, and a bit line discharge circuit. The array of memory cells includes a plurality of columns of memory cells. The plurality of bit lines are respectively coupled to the plurality of columns of memory cells. The bit line discharge circuit is coupled to the plurality of bit lines and includes a plurality of first transistors and a plurality of second transistors. Each first transistor is coupled to one of the plurality of bit lines and a reference current generator to provide a discharge current to the one of the plurality of bit lines in a discharge operation. Each second transistor is coupled to one of the plurality of first transistors to enable the discharge operation. The discharge operation discharges a charge on the plurality of bit lines.

In still another aspect, a method for operating a memory device is disclosed. The memory device includes an array of memory cells having a plurality of columns of memory cells. A plurality of bit lines are respectively coupled to the plurality of columns of memory cells. A bit line discharge operation is performed on the plurality of bit lines. A discharge current is provided to the plurality of bit lines, and the discharge current matches a constant current source. The plurality of bit lines are electrically coupled to a ground voltage source to discharge the plurality of bit lines with the discharge current.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

During the read/program/erase operations of the Flash memory, relatively high positive bias voltages may be applied to each bit line, and the bit lines of the Flash memory have to be discharged at the end of algorithms. The capacitance in the bit lines is primarily due to the capacitance between a bit line and the ground, and the capacitance between two adjacent bit lines through direct coupling or indirect coupling. The voltage applied to bit lines during the read/program/erase operations may charge the capacitors between adjacent bit lines as well as between each bit line and the ground, which needs to be discharged at the end of the operations. The amount of the charge which needs to be discharged may be determined by the capacitance of the bit lines, the capacitance between adjacent bit lines, and the number of bit lines.

Figure 9A:
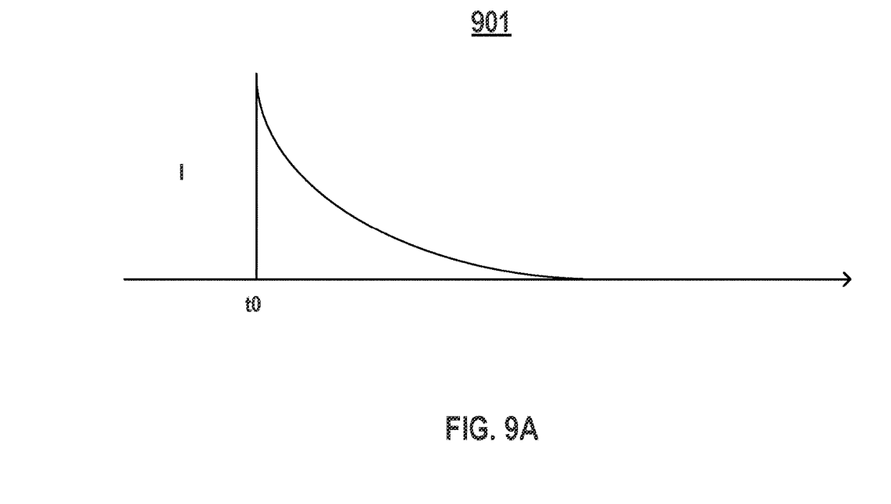
FIGS. 9A and 9B illustrate timing diagrams of discharge operations performed by a memory device.
Figure 9B:
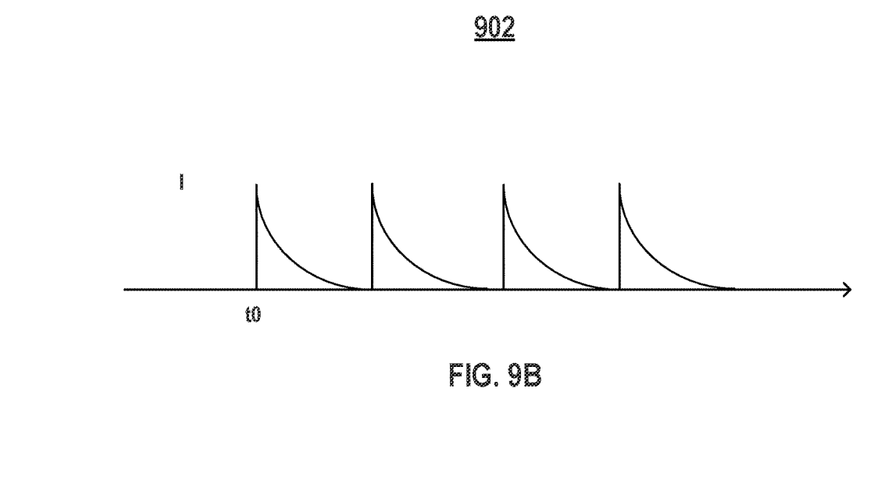

FIG. 9A illustrates a timing diagram 901 of a discharge operation performed by a memory device. According to the capacitor discharge current expression $I=(U/R)e^{(-t/RC)}$, a peak current would appear at the beginning t0 of the discharge operation to discharge the bit lines, and the peak current may exceed the safety limit of the Flash memory and lead to some unexpected issues. In the capacitor discharge current expression, I is the discharge current, U is the voltage on the bit lines, R is the total resistance of the bit lines, and C is the sum of the capacitance between the bit lines and the ground and the capacitance between adjacent bit lines. FIG. 9B illustrates another timing diagram 902 of a discharge operation performed by a memory device. The bit lines may be divided into multiple groups and may be discharged sequentially. Under this situation, the discharge current may be divided into multiple sections, and a peak current would appear at the beginning of each section.

To address one or more of the aforementioned issues, the present disclosure introduces a solution in which the discharge current is controlled and limited to a predefined value, and therefore the peak current could be eliminated. Furthermore, by controlling the discharge current in the discharge operation, the discharge time of the Flash memory could be shortened as well. As used herein, a discharge operation may be an operation to discharge the electric charge on the bit lines, which is stored in the parasitic capacitors, for example, capacitors between adjacent bit lines and capacitors between each bit line and the ground.

Figure 1:
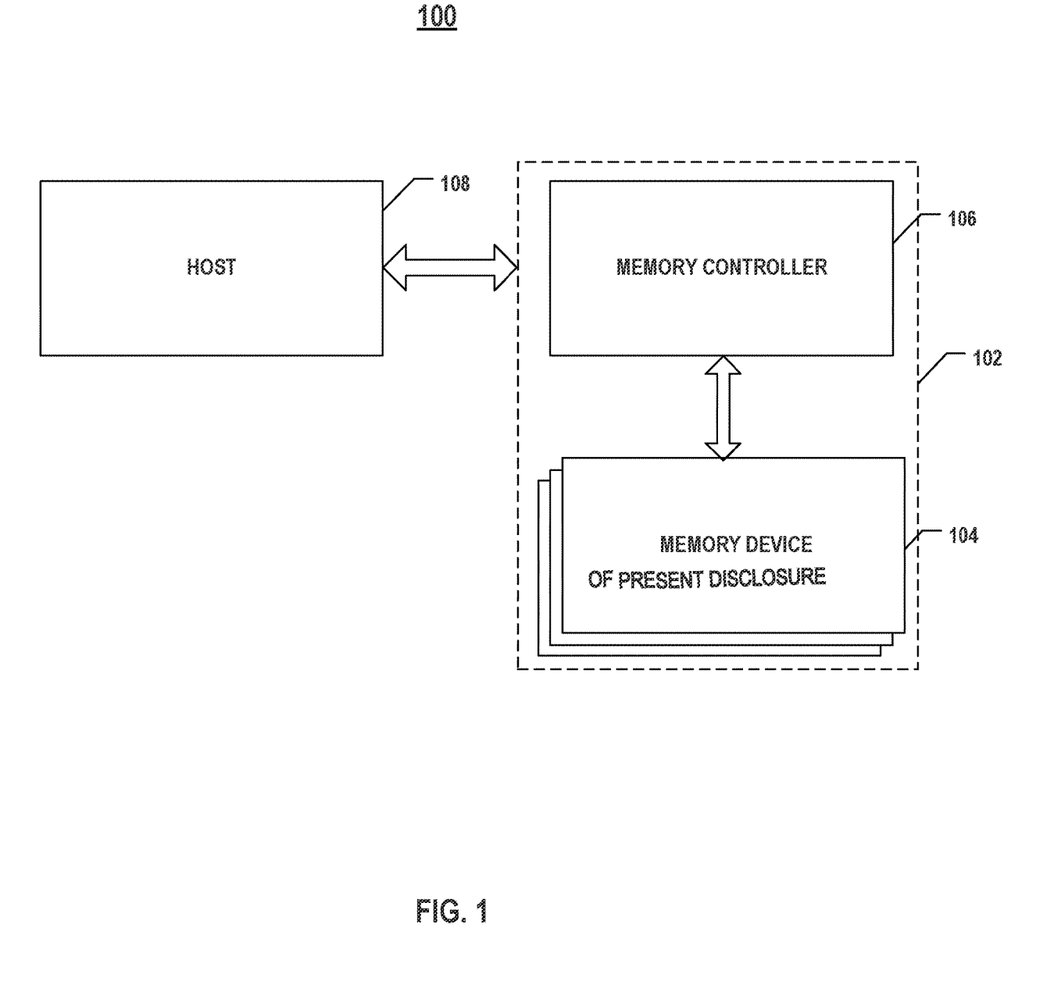
FIG. 1 illustrates a block diagram of an exemplary system having a memory device, according to some aspects of the present disclosure.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices of the present disclosure 104 and a memory controller 106. Host 108 can be a processor of an electronic device, such as a central processing unit (CPU), or a system-on-chip (SoC), such as an application processor (AP). Host 108 can be configured to send or receive data to or from memory devices of the present disclosure 104.

Memory device of the present disclosure 104 can be any memory device disclosed in the present disclosure. As disclosed below in detail, memory device of the disclosure 104, such as a NAND Flash memory device (e.g., a three-dimensional (3D) NAND Flash memory device), may have a controlled and predefined discharge current in the discharge operation of discharging the bit lines. Memory controller 106 is coupled to memory device of the present disclosure 104 and host 108 and is configured to control memory device of the present disclosure 104, according to some implementations. Memory controller 106 can manage the data stored in memory device of the present disclosure 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMNICs) used as data storage for mobile devices, such as smartphones, tablets, laptop computers, etc., and enterprise storage arrays. Memory controller 106 can be configured to control operations of memory device of the present disclosure 104, such as read, erase, and program operations. Memory controller 106 can also be configured to manage various functions with respect to the data stored or to be stored in memory device of the present disclosure 104 including, but not limited to bad-block management, garbage collection, logical-to-physical address conversion, wear leveling, etc. In some implementations, memory controller 106 is further configured to process error correction codes (ECCs) with respect to the data read from or written to memory device of the present disclosure 104. Any other suitable functions may be performed by memory controller 106 as well, for example, formatting memory device of the present disclosure 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
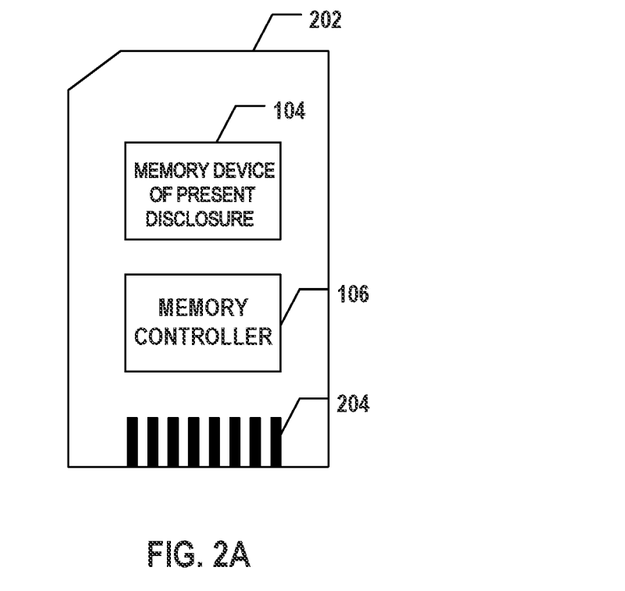
FIG. 2A illustrates a diagram of an exemplary memory card having a memory device, according to some aspects of the present disclosure.
Figure 2B:
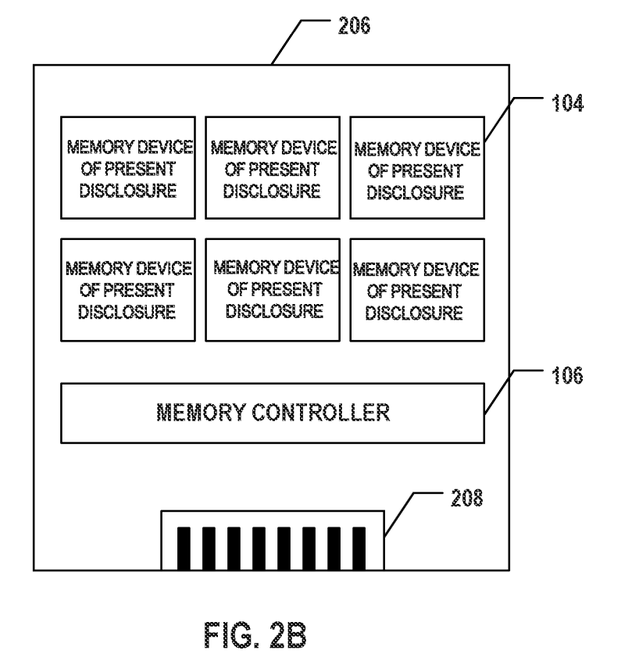
FIG. 2B illustrates a diagram of an exemplary solid-state drive (SSD) having a memory device, according to some aspects of the present disclosure.

Memory controller 106 and one or more memory devices of the present disclosure 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device of the present disclosure 104 may be integrated into a memory card 202. Memory card 202 can include a PC card (PCMCIA, personal computer memory card international association), a CF card, a smart media (SM) card, a memory stick, a multimedia card (MMC, MMCmicro), an SD card (SD, mini SD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices of the present disclosure 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
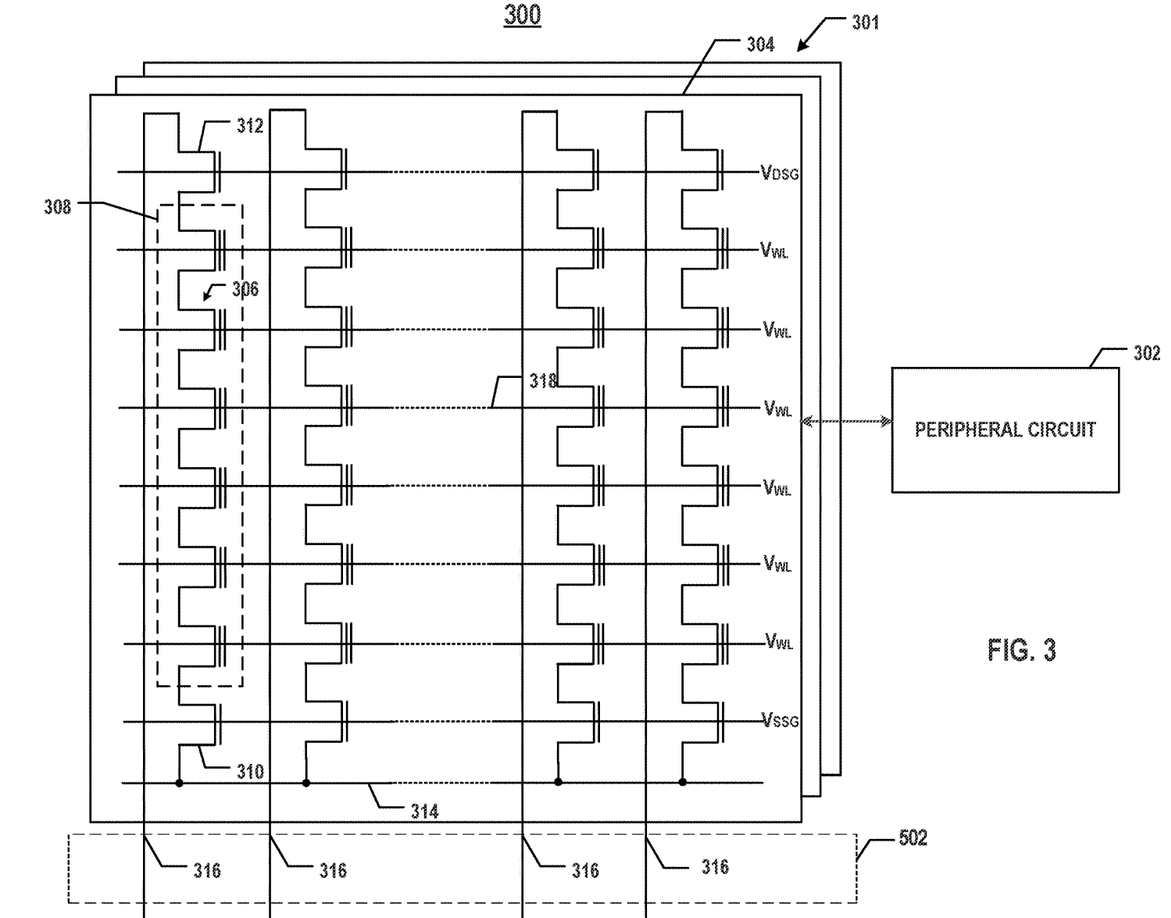
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device of the present disclosure 104 in FIG. 1. Memory device 300 can include a memory cell array 301 and peripheral circuits 302 coupled to memory cell array 301. Memory cell array 301 can be a three-dimensional (3D) NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

As shown in FIG. 3 each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. DSG 312 of each NAND memory string 308 is coupled to a respective bit line 316 from which data can be read or written via an output bus (not shown), according to some implementations. It is understood that multiple blocks 304 may be physically or electrically stacked up, and bit line 316 of multiple blocks 304 may be coupled together.

Figure 4:
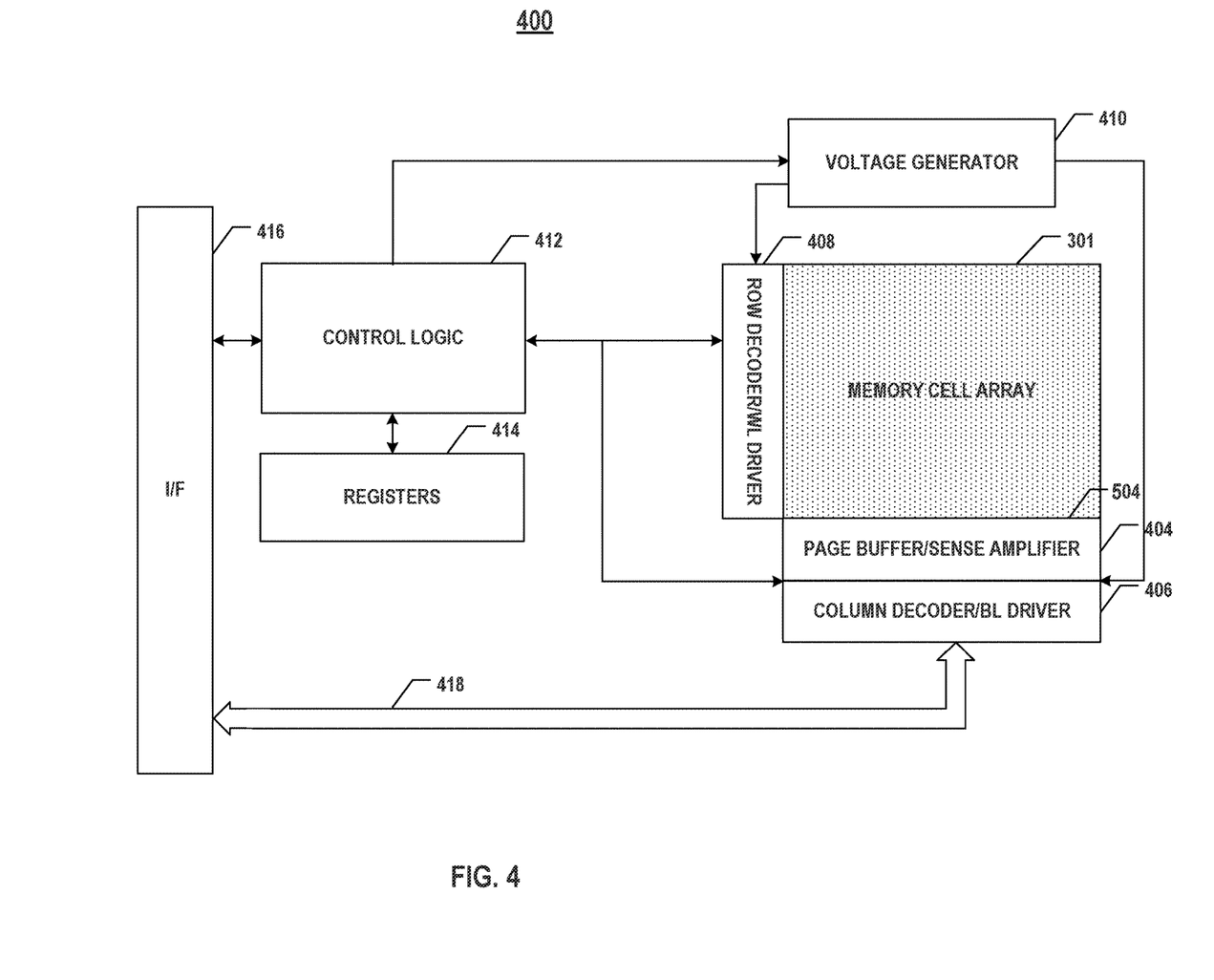
FIG. 4 illustrates a block diagram of an exemplary memory device including a memory cell array and peripheral circuits, according to some aspects of the present disclosure.

FIG. 4 illustrates a block diagram of an exemplary memory device 400 including memory cell array 301, and some exemplary peripheral circuits. The peripheral circuits include a page buffer/sense amplifier 404, a column decoder/bit line driver 406, a row decoder/word line driver 408, a voltage generator 410, control logic 412, registers 414, an interface 416, and a data bus 418. It is understood that in some examples, additional peripheral circuits not shown in FIG. 4 may be included as well.

Page buffer/sense amplifier 404 can be configured to read and program (write) data from and to memory cell array 301 according to the control signals from control logic 412. In one example, page buffer/sense amplifier 404 may store one page of program data (write data) to be programmed into one page of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in a read operation.

During various operations of the Flash memory, e.g., the read/program/erase operations, bit lines 316 of memory cell array 301 need to be discharged at the end of algorithms. In one example, during erase operations, a relatively high positive bias voltage (e.g., above 20 volts) may be applied to each bit line 316. In another example, during read and program operations, a positive bias voltage (e.g., the system voltage Vdd) may be applied to bit line 316 coupled to a selected NAND memory string or an unselected NAND memory string. Nevertheless, the voltage applied to bit line 316 during the read/program/erase operations can charge the capacitors between adjacent bit lines 316 as well as between bit line 316 and the ground, which needs to be discharged at the end of the operations. In some implementations, page buffer/sense amplifier 404 may include a discharge circuit for discharging bit lines 316 during the discharge operation. In some implementations, the residual voltage at the beginning of the discharge operation is the system voltage Vdd or any other positive bias voltage (e.g., 1 volt), and the voltage at the end of the discharge operation is 0 volt (i.e., the ground).

Figure 5:
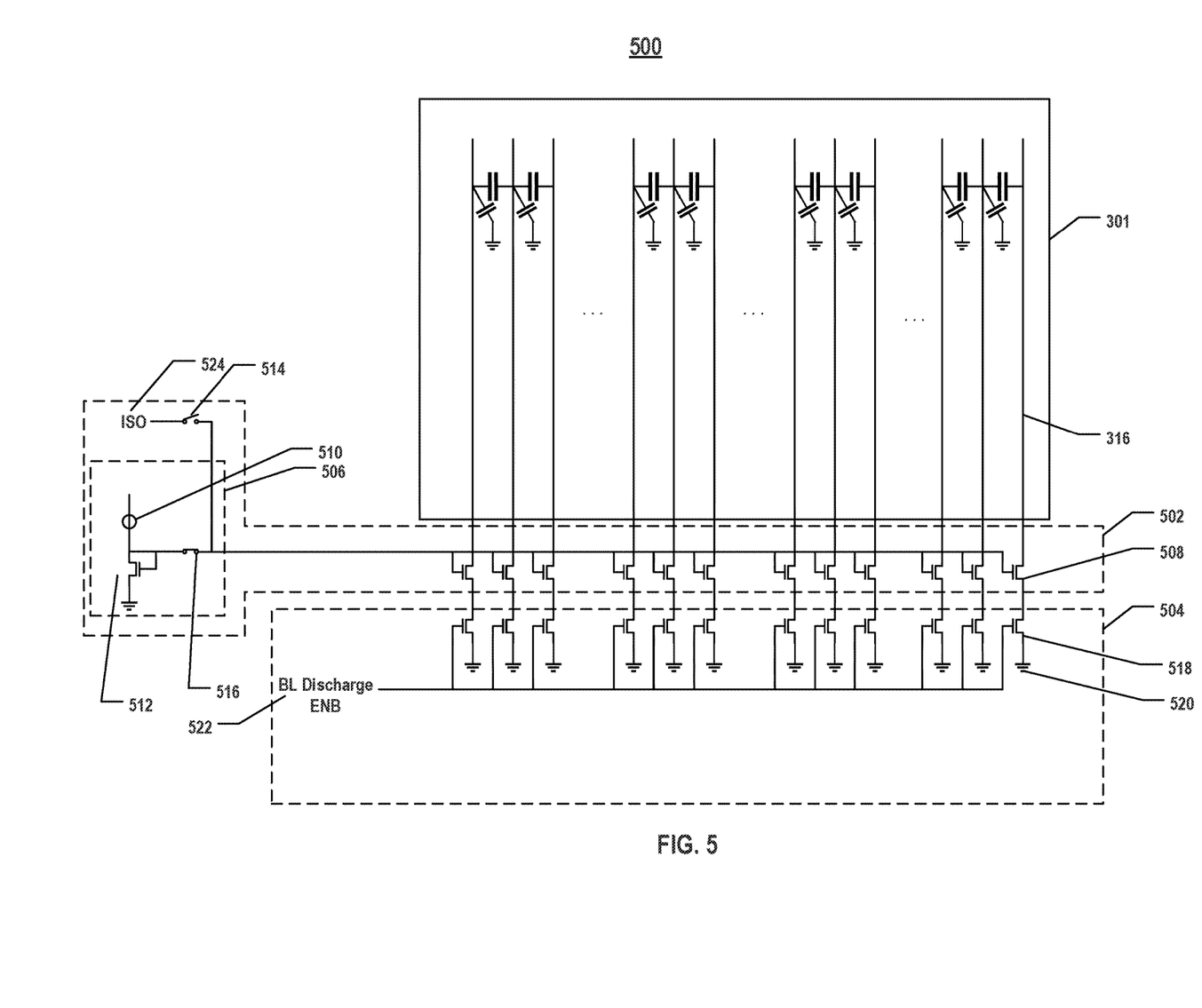
FIG. 5 illustrates a detailed block diagram of an exemplary memory device including a memory cell array and discharge circuits, according to some aspects of the present disclosure.

FIG. 5 illustrates a detailed block diagram of an exemplary memory device 500 including memory cell array 301 and discharge circuits, according to some aspects of the present disclosure. Memory device 500 includes memory cell array 301, bit lines 316, a current control circuit 502, and a discharge enable circuit 504. Bit lines 316 are respectively coupled to the plurality of columns of memory cells as shown in FIG. 3. Current control circuit 502 is coupled to bit lines 316 to control a discharge current in a discharge operation. Discharge enable circuit 504 is coupled to current control circuit 502 to enable the discharge operation. The discharge operation discharges a charge on the plurality of bit lines 316.

As shown in FIG. 5, current control circuit 502 includes a plurality of transistors 508, and each transistor 508 is coupled to one bit line 316. Current control circuit 502 further includes a reference current generator 506. Reference current generator 506 may include a constant current source 510 and a transistor 512. The drain terminal of transistor 512 is coupled to the gate terminal of transistor 512, and the drain terminal of transistor 512 is also coupled to constant current source 510. Constant current source 510 and transistor 512 collectively provide a reference current in current control circuit 502. The gate terminal of transistor 508 is coupled to the drain terminal and the gate terminal of transistor 512. By these connections, transistor 508, transistor 512, and constant current source 510 collectively function as a current mirror. The current value passing through each transistor 508 would match the current value of constant current source 510. In some implementations, the matched current value may be the same as the current value of constant current source 510. In some implementations, the matched current value may be proportional to the current value of constant current source 510 by adjusting the channel length and width of each transistor 508 and transistor 512. By coupling the drain terminal of each transistor 508 to each bit line 316, the discharge current of each bit line 316 may be controlled to the matched current value.

In some implementations, current control circuit 502 may include an isolation signal input 524 for switching off transistors 508 and isolate bit lines 316 from discharge enable circuit 504 when memory device 500 is not in the bit line discharge operation. Isolation signal input 524 and reference current generator 506 may be coupled to a multiplexer. In some implementations, reference current generator 506 may be coupled to the gate terminal of each transistor 508 by the multiplexer in the bit line discharge operation, and isolation signal input 524 may be coupled to the gate terminal of each transistor 508 by the multiplexer when memory device 500 is not in the bit line discharge operation. In some implementations, the multiplexer may include a plurality of switches, e.g., switches 514 and 516 in FIG. 5. In some implementations, the multiplexer may be included in reference current generator 506.

The present disclosure illustrates a metal-oxide-semiconductor field-effect transistor (MOSFET) current mirror in FIG. 5 for explanations. However, it is understood that other variations of current mirrors may be applied to memory device 500 as well, e.g., bipolar junction transistor (BJT) current mirrors, cascade current mirrors, self-biased cascade current mirrors, the Widlar current source, or the Wilson current mirror.

As shown in FIG. 5, discharge enable circuit 504 may include a plurality of transistors 518. In some implementations, discharge enable circuit 504 may be included in page buffer/sense amplifier 404. In some implementations, discharge enable circuit 504 may be an independent circuit between page buffer/sense amplifier 404 and memory cell array 301. Each transistor 518 may be coupled between the source terminal of each transistor 508 and a ground voltage source 520. In some implementations, ground voltage source 520 is a relative voltage corresponding to the supply voltage of memory device 500, and ground voltage source 520 may be 0 volt or a negative voltage corresponding to the supply voltage of memory device 500. The gate terminal of each transistor 518 may be coupled to a discharge enable signal 522. Discharge enable signal 522 may switch on each transistor 518 to couple bit lines 316 to ground voltage source 520 in the bit line discharge operation.

In the bit line discharge operation, each transistor 508 is switched on and is provided the discharge current by reference current generator 506, and transistor 518 is switched on by discharge enable signal 522 and electrically couples each bit line 316 to ground voltage source 520. In some implementations, transistors 508 may be high voltage (HV) transistors. In some implementations, transistors 518 may be low voltage (LV) transistors. In some implementations, transistors 508 may be HV transistors, and transistors 518 may be LV transistors. The HV transistors may operate at a voltage higher than the LV transistors. For example, the HV transistors may operate above the system voltage Vdd, for example, at 6 volts, and the LV transistors may operate between 0 volt and the system voltage Vdd, for example, at 2.5 volts.

FIG. 5 illustrates transistors 518 being switched on/off by discharge enable signal 522. However, it is understood that other kinds of switches that are capable of coupling current control circuit 502 to ground voltage source 520 may be applied to memory device 500 as well.

Figure 7A:
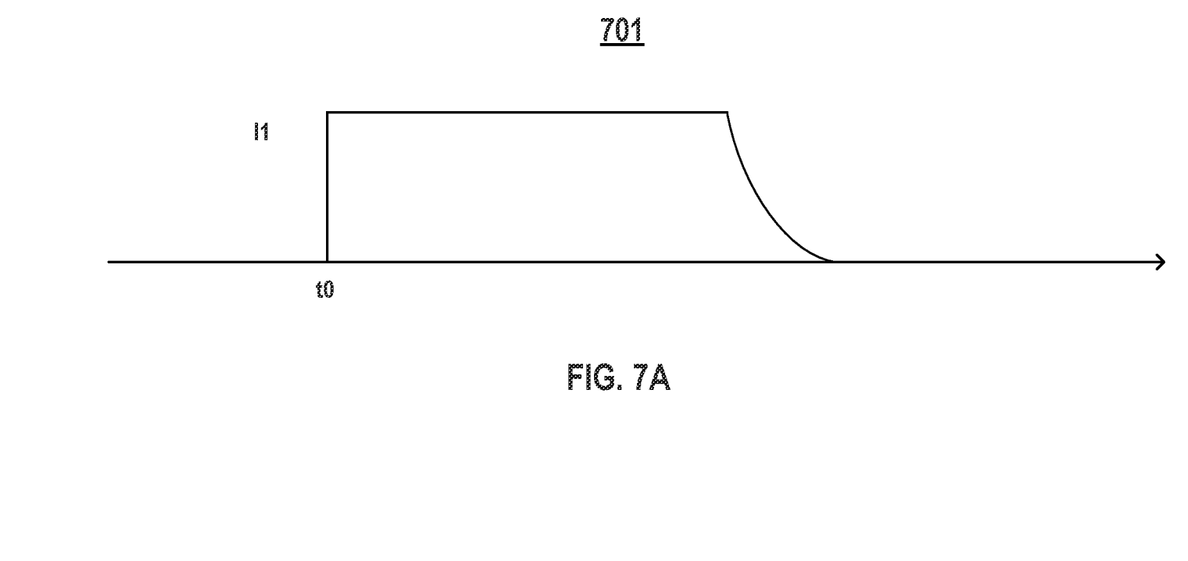
FIG. 7A illustrates a timing diagram of a discharge operation performed by an exemplary memory device, according to some aspects of the present disclosure.

FIG. 7A illustrates a timing diagram 701 of a discharge operation performed by memory device 500, according to some aspects of the present disclosure. As shown in FIG. 7A, the discharge current of memory device 500 is controlled at discharge current I1 at the beginning of the bit line discharge operation. Since transistor 508 and transistors 518 are working in the saturation region as a current mirror, the discharge current may be maintained at I1 during the bit line discharge operation until discharging completion and gradually lowered to zero.

By controlling and limiting the discharge current to a predefined value, the peak current could be eliminated. In addition, by controlling the discharge current in the bit line discharge operation, the discharge time of the flash memory could be shortened as well.

Figure 6:
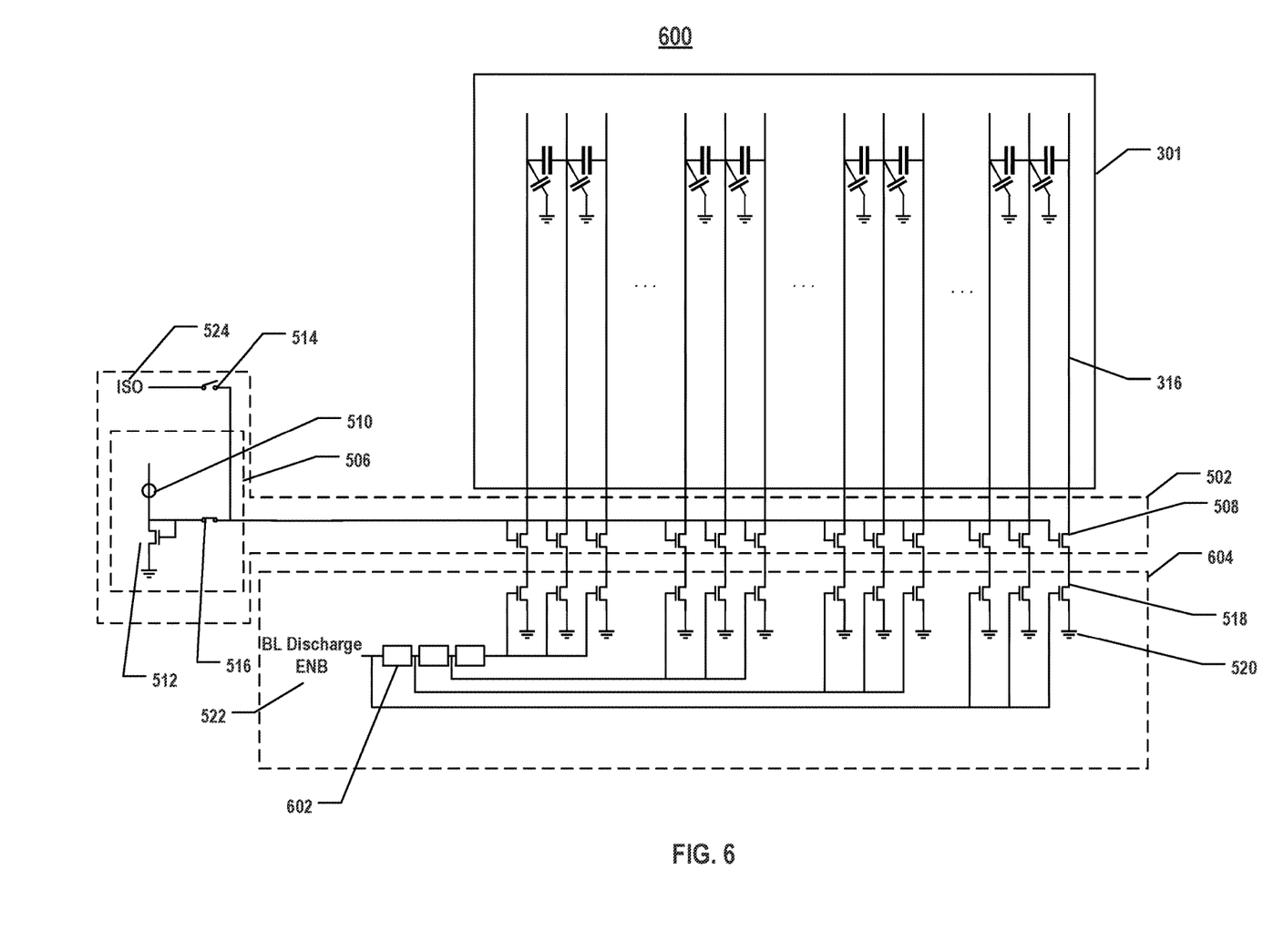
FIG. 6 illustrates a detailed block diagram of another exemplary memory device including a memory cell array and discharge circuits, according to some aspects of the present disclosure.

FIG. 6 illustrates a detailed block diagram of another exemplary memory device 600 including memory cell array 301 and discharge circuits, according to some aspects of the present disclosure. Memory device 600 includes memory cell array 301, bit lines 316, current control circuit 502, and a discharge enable circuit 604. Memory cell array 301, bit lines 316, and current control circuit 502 in FIG. 6 may be similar to or the same as memory cell array 301, bit lines 316, and current control circuit 502 in FIG. 5.

Discharge enable circuit 604 may include a plurality of transistors 518. As shown in FIG. 6, transistors 518 are divided into multiple groups, and the gate terminals of transistors 518 in a same group are connected. Discharge enable circuit 604 may further include a plurality of groups of delay elements 602. In some implementations, each delay element 602 may be a digital clock delay device to delay discharge enable signal 522. In some implementations, delay element 602 may be an analog clock delay device to delay discharge enable signal 522. In some implementations, delay element 602 may be a shift register or a clock skew. In some implementations, delay element 602 may be one or more inverters.

The gate terminals of transistors 518 in different groups are connected to different stages of delay elements 602, and different groups of transistors 518 are delayed with different time periods. In other words, different groups of transistors 518 may be sequentially enabled by staggering control of discharge enable signal 522 at different time periods.

Figure 7B:
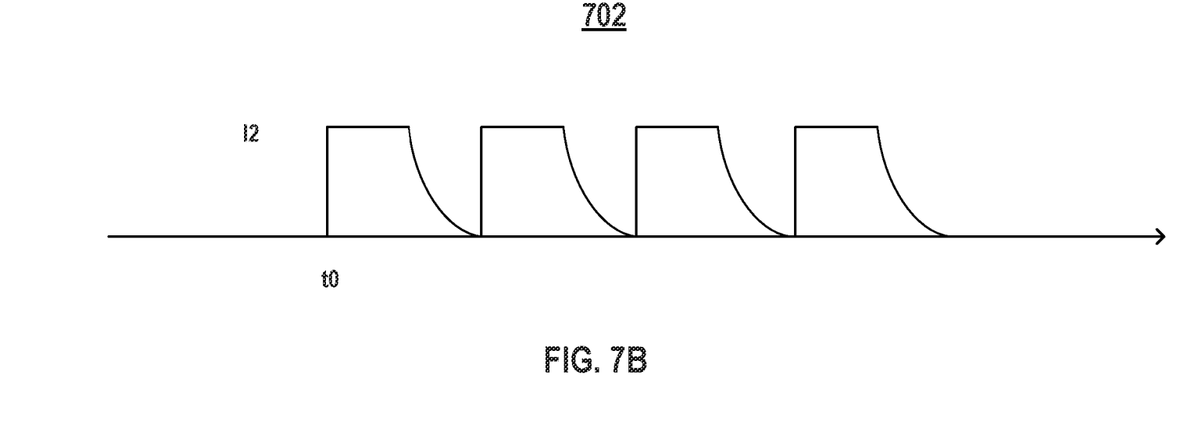
FIG. 7B illustrates a timing diagram of a discharge operation performed by another exemplary memory device, according to some aspects of the present disclosure.

FIG. 7B illustrates a timing diagram 702 of a discharge operation performed by memory device 600, according to some aspects of the present disclosure. In FIG. 7B, transistors 518 are divided into four groups, and the bit line discharge operation of memory device 600 is divided into four time periods. In each time period, one group of bit lines 316 are enabled the bit line discharge operation by discharge enable signal 522, and the discharge current is controlled and limited to discharge current I2. The discharge current may be maintained at I2 during the bit line discharge operation of each group of bit lines 316 until discharging completion and gradually lowered to zero. Then, the next group of bit lines 316 may begin the bit line discharge operation.

Comparing discharge enable circuit 504 of FIG. 5 and discharge enable circuit 604 of FIG. 6, transistors 518 in FIG. 6 are divided into four groups, and the bit line discharge operation of memory device 600 is divided into four time periods. Hence, the total charge on memory cell array 301 needs to be discharged is distributed to four time periods in memory device 600, and in each time period, one fourth of total bit lines 316 of memory cell array 301 are discharged.

Since the discharging loading in each time period in memory device 600 is less than the discharging loading of memory device 500, discharge current I2 in FIG. 7B may be designed to match a current source lower than I1. By using discharge enable circuit 604 of FIG. 6, the hardware requirement of constant current source 510 can be reduced, and the manufacturing cost can also be further reduced.

Figure 8:
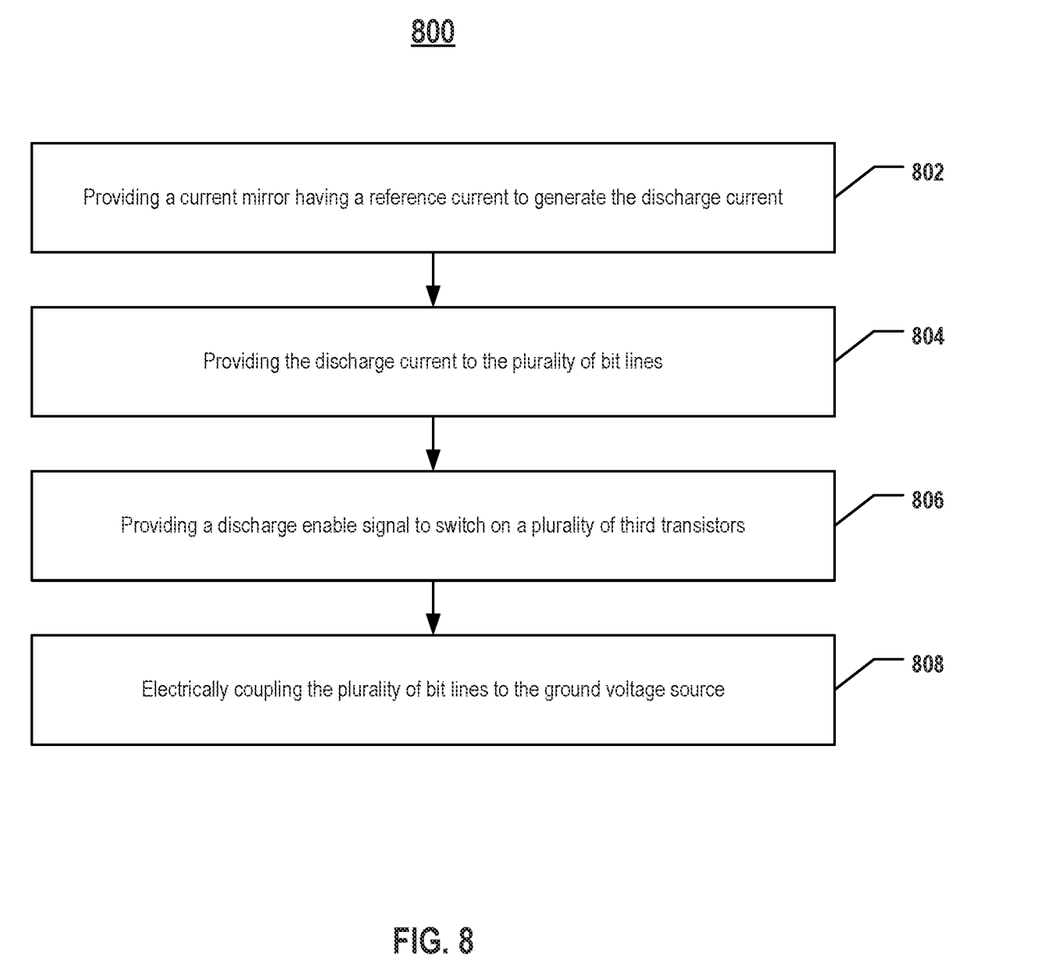
FIG. 8 illustrates a flowchart of a method for discharging a memory device, according to some aspects of the present disclosure.

FIG. 8 illustrates a flowchart of a method 800 for discharging a memory device, according to some aspects of the present disclosure. The memory device includes an array of memory cells, and the array of memory cells includes a plurality of columns of memory cells. A plurality of bit lines are respectively coupled to the plurality of columns of memory cells. A bit line discharge operation is performed on the plurality of bit lines. In the bit line discharge operation, a discharge current may be provided to the plurality of bit lines, and the discharge current matches a constant current source. Memory device 500 in FIG. 5 would be referred to together for a better explanation of the present disclosure.

In operation 802, a current mirror including reference current generator 506 is provided to generate a reference current. Transistor 508, transistor 512, and constant current source 510 collectively function as a current mirror, and constant current source 510 and transistor 512 collectively generate the reference current. The current value passing through each transistor 508 would match the current value of constant current source 510. In some implementations, the matched current value may be the same as the current value of constant current source 510. In some implementations, the matched current value may be proportional to the current value of constant current source 510 by adjusting the channel length and width of each transistor 508 and transistor 512.

In operation 804, the discharge current may be provided to bit lines 316, and by coupling the drain terminal of each transistor 508 to each bit line 316, the discharge current of each bit line 316 may be controlled to the matched current value.

In operation 806, discharge enable signal 522 is provided to the gate terminals of transistors 518 to switch on transistors 518. As described above, in some implementations, the gate terminals of all transistors 518 may be coupled to the same discharge enable signal 522 and be switched on together. In some implementations, transistors 518 may be divided into a plurality of groups, and different groups of transistors 518 may be sequentially switched on by delaying discharge enable signal 522.

By enabling transistors 518, in operation 808, bit lines 316 may be electrically coupled to ground voltage source 520, and the discharge current is controlled by current control circuit 502 that matches constant current source 510. In addition, when memory device 500 is not in the bit line discharge operation, isolation signal input 524 may be provided to switch off transistors 508 and isolate bit lines 316 from discharge enable circuit 504.

By controlling and limiting the discharge current to a predefined value, the peak current could be eliminated. In addition, by controlling the discharge current in the bit line discharge operation, the discharge time of the flash memory could be shortened as well.

According to one aspect of the present disclosure, a memory device is disclosed. The memory device includes an array of memory cells, a plurality of bit lines, a current control circuit, and a discharge enable circuit. The array of memory cells includes a plurality of columns of memory cells. The plurality of bit lines are respectively coupled to the plurality of columns of memory cells. The current control circuit is coupled to the plurality of bit lines to control a discharge current in a discharge operation. The discharge enable circuit is coupled to the current control circuit to enable the discharge operation. The discharge operation discharges a charge on the plurality of bit lines.

In some implementations, the current control circuit includes a current mirror having a discharge current matching a reference current to discharge the plurality of bit lines in the discharge operation. In some implementations, the current control circuit includes a first transistor set having a plurality of first transistors, each first transistor being coupled to one of the plurality of bit lines, and a reference current generator coupled to the first transistor set to control the discharge current of each first transistor in the discharge operation.

In some implementations, the reference current generator includes a constant current source providing the reference current, and each first transistor has the discharge current matching the reference current to discharge one of the plurality of bit lines. In some implementations, the current control circuit further includes an isolation signal input coupled to the first transistor set to switch off the plurality of first transistors and isolate the plurality of bit lines from the discharge enable circuit when the memory device is not in the discharge operation.

In some implementations, the current control circuit further includes a multiplexer coupled between the reference current generator, the isolation signal input, and the first transistor set. The reference current generator is coupled to the first transistor set by the multiplexer in the discharge operation, and the isolation signal input is coupled to the first transistor set by the multiplexer when the memory device is not in the discharge operation. In some implementations, the plurality of first transistors are high voltage transistors.

In some implementations, the discharge enable circuit includes a plurality of second transistors, each second transistor is coupled to one of the plurality of bit lines through the current control circuit. In some implementations, each second transistor is further coupled to a ground voltage source. In some implementations, each second transistor is controlled by a discharge enable signal to switch on the discharge enable circuit in the discharge operation. In some implementations, the plurality of second transistors are low voltage transistors.

In some implementations, the plurality of bit lines are divided into a plurality of groups, and the discharge enable circuit is configured to provide a plurality of staggered signals to sequentially perform the discharge operation on the plurality of groups of the plurality of bit lines. In some implementations, the discharge enable circuit includes a plurality of delay elements in series for providing different delays of the discharge enable signal. In some implementations, the delay element is a digital clock delay device or an analog clock delay device.

In some implementations, the discharge enable circuit is in a peripheral circuit of the memory device. In some implementations, the discharge enable circuit is in a page buffer circuit of the memory device. In some implementations, the reference current is a constant current. In some implementations, the current control circuit is configured to control the discharge current to match a constant current source in the discharge operation. In some implementations, the memory device is a three-dimensional (3D) NAND Flash memory device, and the column of memory cell corresponds to a NAND memory string of the 3D NAND Flash memory device.

According to another aspect of the present disclosure, a memory system is disclosed. The memory system includes a memory device for storing data. The memory device includes an array of memory cells, a plurality of bit lines, and a bit line discharge circuit. The array of memory cells includes a plurality of columns of memory cells. The plurality of bit lines are respectively coupled to the plurality of columns of memory cells. The bit line discharge circuit is coupled to the plurality of bit lines and includes a plurality of first transistors and a plurality of second transistors. Each first transistor is coupled to one of the plurality of bit lines and a reference current generator to provide a discharge current to the one of the plurality of bit lines in a discharge operation. Each second transistor is coupled to one of the plurality of first transistors to enable the discharge operation. The discharge operation discharges a charge on the plurality of bit lines.

In some implementations, the reference current generator includes a third transistor and a constant current source, and the third transistor, the constant current source, and each first transistor form a current mirror. In some implementations, the discharge current matches the constant current source through the current mirror. In some implementations, each second transistor is further coupled to a ground voltage source. In some implementations, each second transistor is controlled by a discharge enable signal to switch on the plurality of second transistors in the discharge operation.

In some implementations, the plurality of bit lines are divided into a plurality of groups, and the discharge enable signal is sequentially provided to the plurality of groups of the plurality of bit lines to sequentially perform the discharge operation on each of the plurality of groups of the plurality of bit lines. In some implementations, the bit line discharge circuit further includes a plurality of delay elements in series for sequentially providing different delays of the discharge enable signal the discharge enable signal to the plurality of groups of the plurality of bit lines. In some implementations, each of the plurality of delay elements is a digital clock delay device or an analog clock delay device.

In some implementations, the bit line discharge circuit further includes an isolation signal input coupled to the plurality of first transistors to switch off the plurality of first transistors and isolate the plurality of bit lines from the plurality of second transistors when the memory device is not in the discharge operation.

In some implementations, the bit line discharge circuit further includes a multiplexer coupled between the reference current generator, the isolation signal input, and the plurality of first transistors. The reference current generator is coupled to the plurality of first transistors by the multiplexer in the discharge operation, and the isolation signal input is coupled to the plurality of first transistors by the multiplexer when the memory device is not in the discharge operation. In some implementations, the plurality of first transistors are high voltage transistors. In some implementations, the plurality of second transistors are low voltage transistors.

In some implementations, the memory device is a three-dimensional (3D) NAND Flash memory device, and the column of memory cell corresponds to a NAND memory string of the 3D NAND Flash memory device.

According to still another aspect of the present disclosure, a method for operating a memory device is disclosed. The memory device includes an array of memory cells having a plurality of columns of memory cells. A plurality of bit lines are respectively coupled to the plurality of columns of memory cells. A bit line discharge operation is performed on the plurality of bit lines. A discharge current is provided to the plurality of bit lines, and the discharge current matches a constant current source. The plurality of bit lines are electrically coupled to a ground voltage source to discharge the plurality of bit lines with the discharge current.

In some implementations, a current mirror having a reference current is provided to generate the discharge current, and the discharge current is provided to the plurality of bit lines. In some implementations, a constant current source coupled to a drain terminal of a first transistor is provided, and the drain terminal of the first transistor is connected to a gate terminal of the first transistor. A plurality of second transistors coupled to the plurality of bit lines are provided, a drain terminal of each second transistor is coupled to one of the plurality of bit lines, and the gate terminal of the first transistor is coupled to a gate terminal of each second transistor.

In some implementations, a discharge enable signal is provided to switch on a plurality of third transistors to electrically coupling the plurality of bit lines to the ground voltage source. In some implementations, the plurality of third transistors are provided coupled between the plurality of second transistors and the ground voltage source, and a drain terminal of each third transistor is coupled to a source terminal of each second transistor. The discharge enable signal is provided to the plurality of third transistors to enable the bit line discharge operation, and the discharge enable signal is input to a gate terminal of each third transistor. In some implementations, the plurality of bit lines are isolated from the ground voltage source when the memory device does not perform the bit line discharge operation.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
an array of memory cells comprising a plurality of columns of memory cells;
a plurality of bit lines respectively coupled to the plurality of columns of memory cells;
a current control circuit connected between the array of memory cells and a page buffer circuit and comprising first transistors, the current control circuit being coupled to the plurality of bit lines; and
a discharge enable circuit coupled between the current control circuit and a ground,
wherein each of first terminals of the first transistors is in connection with one of the bit lines, each of second terminals of the first transistors is in connection with the discharge enable circuit, and third terminals of the first transistors are in connection with a reference current generator of the current control circuit.

2. The memory device of claim 1, wherein the second terminals of the first transistors are in direct connection with the discharge enable circuit.

3. The memory device of claim 1, wherein the current control circuit is configured to control a discharge current flowing through the plurality of bit lines in a discharge operation.

4. The memory device of claim 3, wherein the current control circuit further comprises:
an isolation signal input coupled to the first transistors to switch off the first transistors and isolate the plurality of bit lines from the discharge enable circuit when the memory device is not in the discharge operation.

5. The memory device of claim 4, wherein the current control circuit further comprises a first switch coupled between the reference current generator and the isolation signal input.

6. The memory device of claim 5, wherein the reference current generator further comprises a second switch coupled between a constant current source and the first switch.

7. The memory device of claim 3, wherein the discharge enable circuit comprises second transistors, and each of the second transistors is coupled to one of the plurality of bit lines through a corresponding one of the first transistors.

8. The memory device of claim 7, wherein each of the second transistors is further coupled to the ground.

9. The memory device of claim 7, wherein each of the second transistors is controlled by a discharge enable signal to switch on in the discharge operation.

10. The memory device of claim 9, wherein the plurality of bit lines are divided into a plurality of groups, and the discharge enable circuit is configured to provide a plurality of staggered signals to sequentially perform the discharge operation on the plurality of groups of the plurality of bit lines.

11. The memory device of claim 10, wherein the discharge enable circuit comprises a plurality of delay elements in series for providing different delays of the discharge enable signal.

12. The memory device of claim 11, wherein each of the plurality of delay elements is a digital clock delay device or an analog clock delay device.

13. The memory device of claim 7, wherein the first transistors operate at a first supply voltage, and the second transistors operate at a second supply voltage, the second supply voltage being lower than the first supply voltage.

14. The memory device of claim 1, wherein the discharge enable circuit is configured to couple the bit lines to the ground through the current control circuit.

15. The memory device of claim 1, wherein the discharge current matches a reference current provided by the reference current generator.

16. The memory device of claim 15, wherein the reference current generator comprises a constant current source providing the reference current, and each of the first transistors comprises the discharge current matching the reference current to discharge one of the plurality of bit lines.

17. The memory device of claim 15, wherein the reference current comprises a constant current.

18. The memory device of claim 1, further comprising a peripheral circuit comprising the page buffer circuit, wherein the page buffer circuit comprises the discharge enable circuit.

19. A memory system, comprising:
a memory device configured to store data, the memory device comprising:
an array of memory cells comprising a plurality of columns of memory cells;
a plurality of bit lines respectively coupled to the plurality of columns of memory cells;
a current control circuit connected between the array of memory cells and a page buffer circuit and comprising first transistors, the current control circuit being coupled to the plurality of bit lines; and
a discharge enable circuit coupled between the current control circuit and a ground,
wherein each of first terminals of the first transistors is in connection with one of the bit lines, each of second terminals of the first transistors is in connection with the discharge enable circuit, and third terminals of the first transistors are in connection with
a reference current generator of the current control circuit; and
a memory controller coupled with the memory device and configured to manage the data stored in the memory device.

20. A method for operating a memory device, the memory device comprising an array of memory cells comprising a plurality of columns of memory cells, and a plurality of bit lines respectively coupled to the plurality of columns of memory cells, the method comprising:
turning on a first transistor comprising a gate terminal that is connected to a reference current generator, the first transistor being connected between the array of memory cells and a page buffer circuit; and
turning on a second transistor that is connected between the first transistor and a ground to discharge the plurality of bit lines with a discharge current in a discharge operation, wherein the discharge current matches a reference current provided by the reference current generator.

* * * * *